United States Patent [19]

Kanaishi

[11] Patent Number: 5,280,455
[45] Date of Patent: Jan. 18, 1994

[54] VOLTAGE SUPPLY CIRCUIT FOR USE IN AN INTEGRATED CIRCUIT

[75] Inventor: Yoshikazu Kanaishi, Kanagawa, Japan

[73] Assignee: Sony Corporation, Tokyo, Japan

[21] Appl. No.: 680,821

[22] Filed: Apr. 5, 1991

[30] Foreign Application Priority Data

Apr. 6, 1990 [JP] Japan .................................. 2-90426

[51] Int. Cl.⁵ .............................................. G11C 14/00
[52] U.S. Cl. ...................................... 365/229; 307/64
[58] Field of Search .................... 307/64, 66; 365/229; 371/14, 66

[56] References Cited

U.S. PATENT DOCUMENTS 4,788,450  11/1988  Wagner .............................. 307/66 X Primary Examiner—James B. Mullins
Attorney, Agent, or Firm—Hill, Steadman & Simpson

[57] ABSTRACT

The invention relates to a voltage supply circuit used in a semiconductor integrated circuit wherein switching between voltages generated is carried out in dependency upon whether the circuit is in an ordinary operating state or in a standby state. This voltage supply circuit includes a first reference voltage generator for supplying a reference voltage through an amplifier circuit to an internal circuit in the operating state, and a power supply voltage converter for supplying a voltage to the internal circuit at least in the standby state, wherein a second reference voltage generator provided independently of the first reference voltage generator becomes operative for a transient time period during which the second reference voltage generator shifts from the standby state to the operating state. By the action of the second reference voltage generator, a setup time at the time of start of the operation is shortened. Further, by allowing the first reference voltage generator to be inactive in the standby state, low power consumption is realized.

8 Claims, 6 Drawing Sheets

VOLTAGE SUPPLY CIRCUIT FOR USE IN AN INTEGRATED CIRCUIT

BACKGROUND OF THE INVENTION

1. Field of the Invention

This invention relates to a voltage supply circuit used in a semiconductor integrated circuit such as a memory device, etc., and more particularly to a voltage supply circuit for operating an internal circuit by using a predetermined reference voltage.

2. Description of the Prior Art

In MOS type semiconductor integrated circuit devices, a technology for allowing an internal power supply voltage to be down converted has been used from a viewpoint of device reliability, etc. (See, e.g., Nikkei Microdevice, No. 52, pp. 91 to 95, October, 1989).

Meanwhile, in semiconductor memories such as a static RAM, etc., there is a mode in a standby state for interrupting the circuit to suppress current consumption (standby mode) in addition to a mode in an operating state for performing an ordinary read/write operation. It is necessary to suppress a current consumption in the standby state.

FIGS. 1 to 3 show conventional internal voltage supply circuits, respectively.

First, in the circuit shown in FIG. 1, an external power supply voltage Ext-Vcc is delivered from an external terminal 5 to a reference voltage generator 1 for generating a predetermined internally down converted reference voltage. An output from the reference voltage generator 1 is inputted to the minus terminal of a differential amplifier 3. An output from the differential amplifier 3 is delivered to the gate of a pMOS transistor 4. The drain of the pMOS transistor 4 is connected to the plus terminal of the differential amplifier 3, and a potential on the drain and an output voltage of the reference voltage generator 1 are imaginarily shorted. The potential on the drain of the pMOS transistor 4 is delivered to the internal circuit as an internal power supply voltage Int-Vcc. Further, a standby power supply voltage converter 2 of a low power consumption is provided independently of the reference voltage generator 1. In use, switching between the reference voltage generator 1 and the standby power supply voltage converter 2 is carried out in response to a chip enable signal CE.

Further, the circuit shown in FIG. 2 includes a reference voltage generator 11, a differential amplifier 13 and a pMOS transistor 14 which are similar to those of the circuit shown in FIG. 1, respectively. The feature of the FIG. 2 circuit is as follows. The standby power supply voltage converter 12 is operating at all times. In response to a chip enable signal CE, the reference voltage generator 11 and the differential amplifier 13 are controlled so that they are operative. The reference voltage generator 11 and the differential amplifier 13 are placed in an OFF state in the standby state.

In addition, the circuit shown in FIG. 3 includes a single reference voltage generator 21 for generating a reference voltage, and two differential amplifiers, i.e., a differential amplifier 22 for use in the operating state and a differential amplifier 23 for use in the standby state. In this circuit, the reference voltage generator 21 is operating at all times. In the operating state, the differential amplifier 23 is placed in an OFF state. Outputs from the differential amplifiers 22 and 23 are inputted to the pMOS transistors 24 and 25, respectively. Thus, an internal power supply voltage Int-Vcc is taken out from the drain commonly connected of the pMOS transistors 24 and 25.

However, with the above-described circuits (FIGS. 1 to 3), the following problem would occur.

First, in the circuit shown in FIG. 1 or 2, for a transient time period from the standby state to the operating state, it is necessary to wait rising of outputs from the reference voltage generator 1 or 11, and/or the differential amplifier 3 or 13 which have been respectively in OFF state. For example, if these circuits have no setup time, the internal power supply voltage Int-Vcc disadvantageously varies, or the like. In contrast, if these circuits have a setup time, the time required for CE access is delayed by that time.

Further, in the case of the circuit shown in FIG. 3, at the time of switching from the standby state to the operating state, the differential amplifier 23 is only switched to the differential amplifier 22. The setup time can be reduced to a relatively short time required for rising of an output from the differential amplifier 22. However, since the reference voltage generator 21 operates at all times, and the differential amplifier 23 is operating even in the standby state, the power consumption becomes large.

SUMMARY OF THE INVENTION

An object of this invention is to provide a voltage supply circuit used in a semiconductor integrated circuit to realize a setup of a short time during a transient time period from the standby state to the operating state, and to realize low power consumption.

According to the invention, there is provided a voltage supply circuit comprising a first reference voltage generator for supplying a reference voltage through an amplifier circuit to an internal circuit in an operating state and caused to be placed in an OFF state in a standby state, a power supply voltage converter for supplying a voltage to the internal circuit at least in the standby state, and a second reference voltage generator for driving the amplifier circuit during a transient time period from the standby state to the operating state. By operating the second reference voltage generator during the transient time period from the standby state to the operating state, the setup time required from the standby state to the operating state can be reduced.

Further, since the first reference voltage generator is turned OFF in the standby state, this circuit is not required to be operated, resulting in low power consumption.

According to an embodiment of this invention, switching between the second and first reference generators is carried out by means of a required changeover switch. Such a switching is conducted in response to a chip enable signal or a chip select signal for carrying out switching between the standby state and the operating state.

DESCRIPTION OF THE PREFERRED EMBODIMENT

Figure 1:
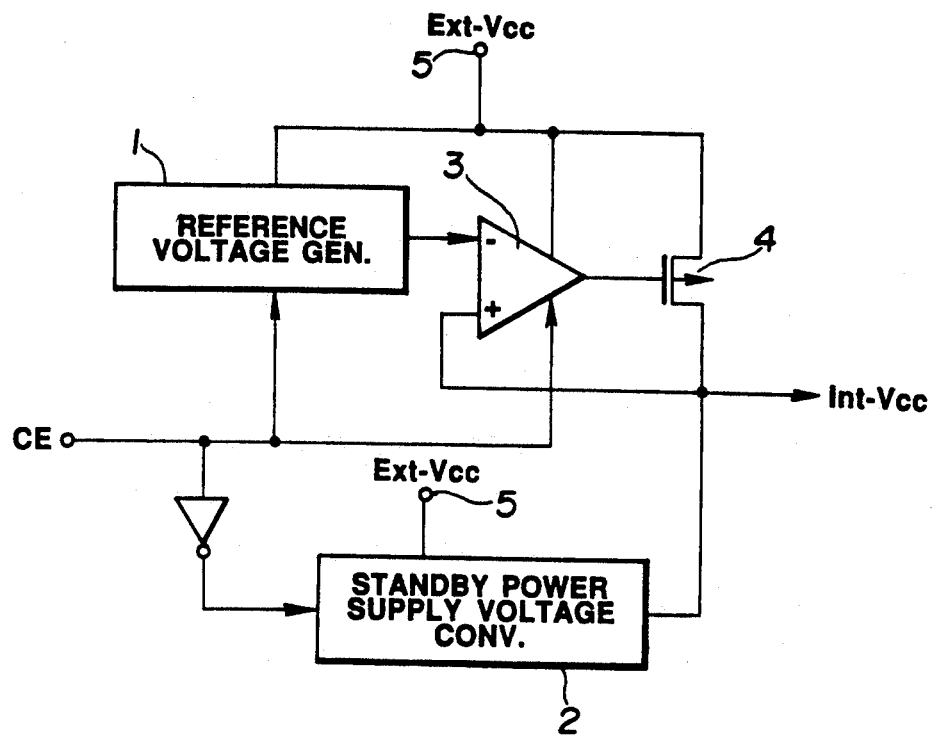
FIG. 1 is a block diagram showing an example of a conventional voltage supply circuit.
Figure 2:
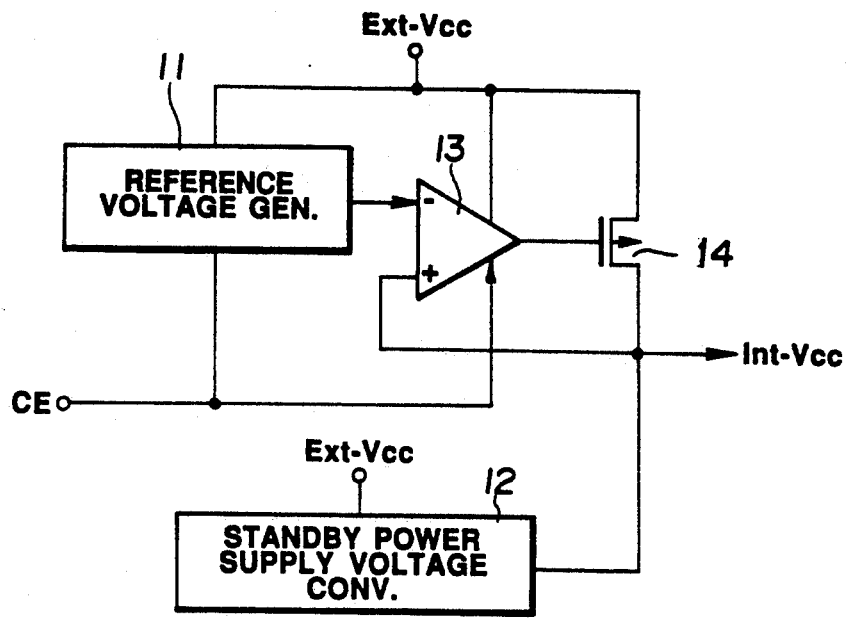
FIG. 2 is a block diagram showing another example of a conventional voltage supply circuit.
Figure 3:
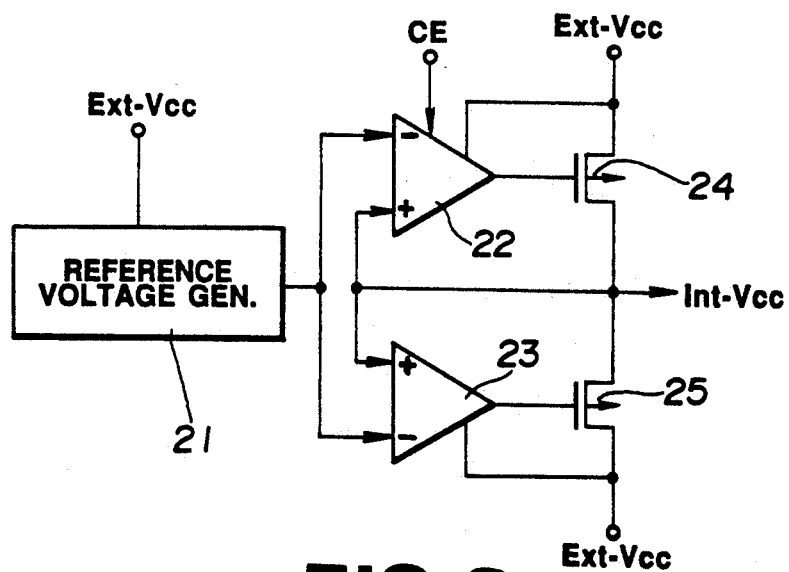
FIG. 3 is a block diagram showing a further example of a conventional voltage supply circuit.
Figure 4:
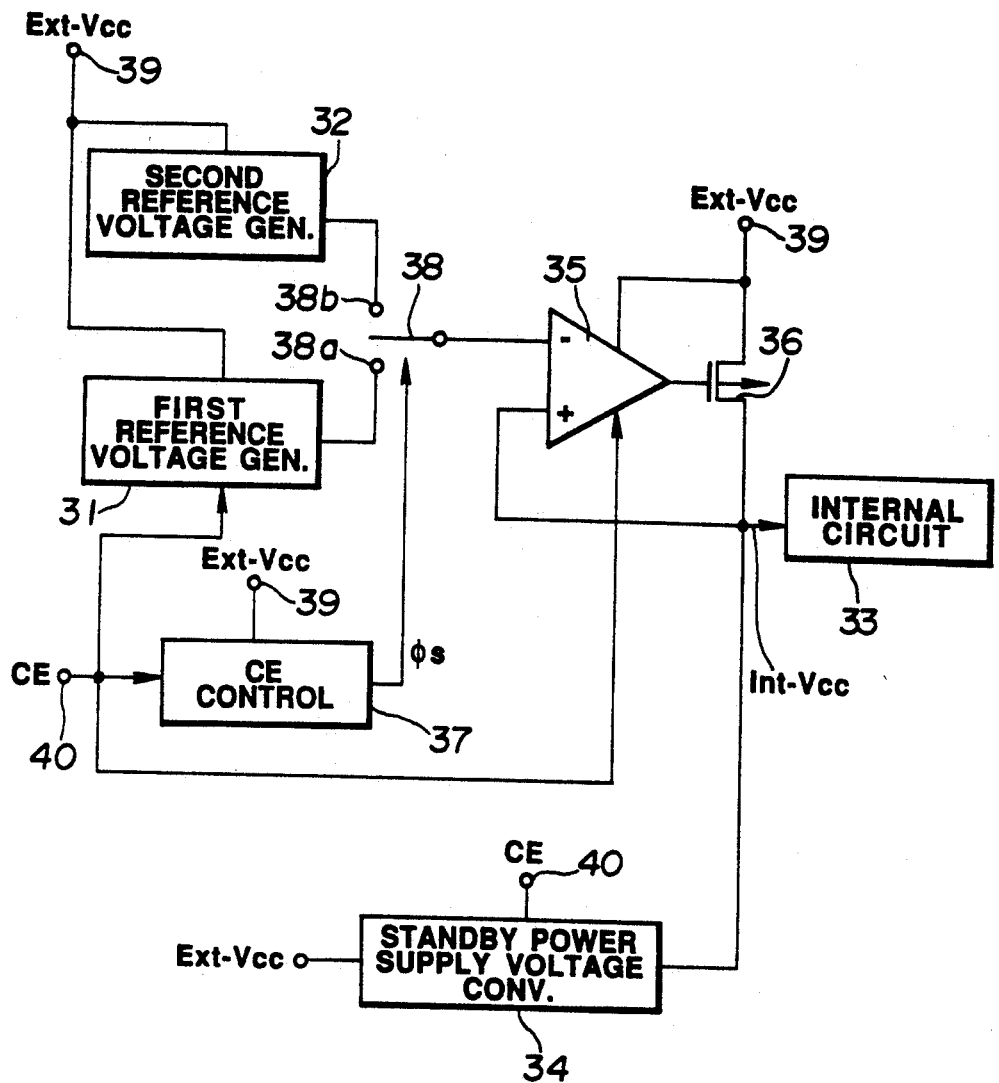
FIG. 4 is a block diagram showing an embodiment of a voltage supply circuit for supplying a reference voltage and a standby voltage according to this invention.

A voltage supply circuit used in a semiconductor integrated circuit of this embodiment has a circuit configuration shown in FIG. 4.

First, an internal circuit 33 is a circuit such as a memory cell array or a peripheral circuit, etc. if this circuit is, e.g., a static RAM, and is comprised of an integrated circuit of MOS transistor, etc.

A first reference voltage generator 31 is a circuit which becomes operative in the operating state to generate an internal power supply voltage Int-Vcc delivered to the internal circuit 33. The power consumption is set to a relatively large value in order to prevent fluctuation in the internal power supply voltage. The first reference voltage generator 31 is supplied with an external power supply voltage Ext-Vcc through an external terminal 39 to generate an internal power supply voltage Int-Vcc provided by pulling down the external power supply voltage Ext-Vcc. The first reference voltage generator 31 is controlled in dependency upon a signal level of a chip enable signal CE delivered through an external terminal 40. Namely, when the chip enable signal CE is at "H" level (high level), the first reference voltage generator 31 is operative, while when the chip enable signal CE is at "L" level (low level), the first reference voltage generator 31 is inoperative. When the chip enable signal is at "L" level, since the voltage supply circuit is in a standby state, the first reference voltage generator 31 is turned OFF in the standby state.

On the other hand, a second reference voltage generator 32 is operative at all times irrespective of whether the voltage supply circuit is in a standby mode or in an operating mode. Particularly, during a transient time period from the standby state to the operating state, this circuit 32 has a function to drive a differential amplifier 35 during the transient time period from the standby state to the operating state. The second reference voltage generator 32 is supplied with an external power supply voltage Ext-Vcc through the external terminal 39 to generate a required reference voltage. It is preferable that the second reference voltage generator 32 has a relatively small power consumption because it is operative at all times. In this embodiment, the second reference generator 32 has a circuit configuration shown in FIG. 5 which will be described later.

Outputs from the first and second reference generators 31 and 32 are delivered to terminals 38a and 38b of a switch 38, respectively. This switch 38 is constructed as a changeover switch. Accordingly, the switch 38 can selectively deliver one of outputs from the respective voltage generators 31 and 32 to the minus terminal of the differential amplifier 35 of the next stage. The switch 38 is controlled by a signal $\phi s$ generated at a CE control circuit 37. When the signal $\phi s$ is at "H" level, an output from the first reference generator 31 is delivered to the minus terminal of the differential amplifier 35. In contrast, when the signal $\phi /s$ is at "L" level, an output from the second voltage generator 32 is delivered to the minus terminal of the differential amplifier 35.

The differential amplifier 35 is an amplifier circuit operative in the operating state where the chip enable signal CE is at "H" level to deliver a predetermined internal power supply voltage Int-Vcc to the internal circuit 33 on the basis of a reference voltage generated at the first reference voltage generator 31. In the standby state where the chip enable signal CE is at "L" level, the differential amplifier 35 is not operative. The output terminal of the differential amplifier 35 is connected to the gate of a p MOS transistor 36. The source of the pMOS transistor 36 is connected to the external terminal 39. Thus, an external power supply voltage Ext-Vcc is delivered to the drain of the pMOS transistor 36. Further, the drain of the pMOS transistor 36 is connected to the internal circuit 33, and is connected to the plus terminal of the differential amplifier 35. Since such a feedback loop is formed, the both input terminals of the differential amplifier 35 are imaginarily shorted. At this time, in the case where the differential amplifier 35 is operative, a voltage on the minus terminal presents the internal power supply voltage Int-Vcc delivered to the internal circuit 33 as it is.

The above-mentioned CE control circuit 37 is a circuit to generate a signal $\phi s$ for controlling the switch 38 as described above. To the CE control circuit 37, a chip enable signal CE is delivered from the external terminal 40, and an external power supply voltage Ext-Vcc is delivered from the external terminal 39.

Figure 6:
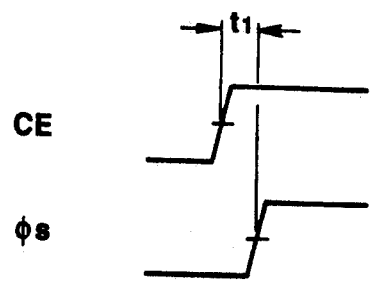
FIG. 6 is a waveform diagram showing the timing relationship between a signal CE and a signal o/s used in the circuit shown in FIG. 4.

Explanation will now be given in connection with the relationship between the chip enable signal CE and the signal $\phi s$ with reference to FIG. 6. The signal $\phi s$ is a signal provided by delaying the chip enable signal CE by a predetermined time 1. This time t1 corresponds to a time required until the first reference generator 31 sets up. When a time t1 has passed from the time of rise of the chip enable signal CE, the first reference voltage generator 31 generates a reference voltage of the internal power supply voltage Int-Vcc securely internally pulled down.

The standby power supply voltage converter 34 is a circuit for supplying a voltage to the internal circuit 33 at least in the standby state, and has a small power consumption. Also to the standby power supply voltage converter 34, both the external power supply voltage and the chip enable signal CE are delivered.

The operation of the voltage supply circuit of such a circuit configuration will now be described. Initially, in the standby state, the chip enable signal CE is caused to be at "L" level and the first reference voltage generator 31 is placed in an inoperative state. Further, the differential amplifier 35 is also inoperative. At this time, since the second reference voltage generator 32 is in an operative state and the signal $\phi s$ is at "L" level, the switch 38 is switched to the terminal 38b side. However, since the differential amplifier 35 is kept inoperative, there is no possibility that the pMOS transistor 36 is driven. Further, in the standby state, the standby power supply converter 34 is active. As a result, an output voltage of the standby power supply voltage converter 34 is delivered to the internal circuit 33. As stated above, in the standby state, both the standby power supply voltage converter 34 and the second reference voltage generator 32 which have low power consumption are operative. Thus, the power consumption in the standby state can be reduced.

In the next operating state where the chip enable signal CE shifts from "L" level to "H" level, so the standby state is completed, the standby power supply voltage converter 34 is turned OFF, and the first reference voltage generator 31 and the differential amplifier 35 are instead placed in an active state. However, since it takes much time until the first reference voltage generator 31 stably generates a reference voltage, the second reference voltage generator 32 instead generates a reference voltage during a transient time period until the operating state from the standby state in order to stabilize the internal power supply voltage Int-Vcc. Namely, at the time when the chip enable signal CE shifts from "L" level to "H" level, the standby power supply voltage converter 34 begins shifting to the OFF state. Thus, the first reference voltage generator 31 begins to become active. At this time, a signal $\phi$s provided by delaying the chip enable signal CE, which is generated from the CE control circuit 37 is still at "L" level. To the differential amplifier 35 which begins to become operative, a voltage generated at the second reference voltage generator 32 is delivered through the switch 38. Accordingly, the differential amplifier 35 promptly drives the pMOS transistor 36 on the basis of a reference voltage from the second reference voltage generator 32, thus making it possible to deliver a required internal power supply voltage Int-Vcc to the internal circuit 33. For this reason, the CE access time can be sufficiently reduced.

For a time period during which a voltage from the second reference voltage generator 32 is delivered to the differential amplifier 35, the first reference voltage generator 31 is gradually stabilized to begin generating a predetermined voltage internally pulled down. That time point corresponds to the time point when a time 1 has passed after the rise of the signal CE (see FIG. 6). At the time point when the first reference voltage generator 31 is stabilized, the signal $\phi$s shifts from "L" level to "H" level. As a result, the switch 38 is switched from the terminal 38b side to the terminal 38a side. Thus, an already stabilized voltage from the first reference voltage generator 31 is delivered to the differential amplifier 35. When the first reference generator 31 supplies an internal reference voltage in a manner stated above, the voltage supply circuit is brought into the operating state. At times subsequent thereto, an internal power supply voltage Int-Vcc internally pulled down by the first reference voltage generator 31 is delivered to the internal circuit 33.

An example of an actual circuit of the second reference voltage generator 32 for supplying a voltage to the differential amplifier 35 during the above-described transient time period will now be described with reference to FIG. 5.

Figure 5:
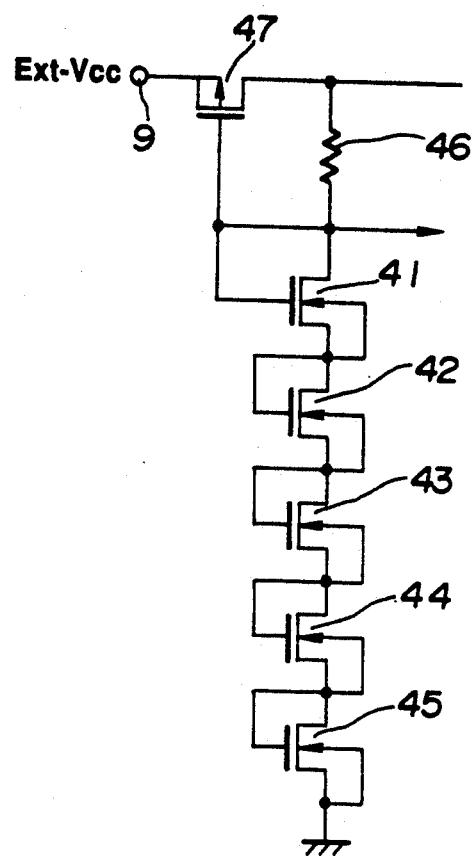
FIG. 5 is a circuit diagram showing an actual configuration of the second reference voltage generator shown in FIG. 4.

As shown in FIG. 5, the second reference voltage generator 32 includes five nMOS transistors 41 to 45 connected in series, and further includes a resistor 46 having a high resistance value, and a pMOS transistor 47 for high speed pull-up, e.g., at the time of recovery of the power supply voltage, etc.

More particularly, the gate and the drain of each of n MOS transistors 41 to 45 are connected to each other. Thus, these transistors function as diodes, respectively. The source of the n MOS transistor 44 of the series circuit including nMOS transistors 41 to 44 is connected to the drain of the nMOS transistor 45 of the final stage. Further, ground voltage GND is applied to the source of the nMOS transistor 45. The drain of the nMOS transistor 41 is connected to one end of a resistor 46 having a high resistance value. An external power supply voltage Ext-Vcc is delivered to the other end of the resistor 46. An output voltage is taken out from the drain of the n MOS transistor 41. During a transient time period from the standby state to the operating state, that output voltage is delivered to the above-described differential amplifier 35. The gate of a p MOS transistor 47 is connected to the drain of the n MOS transistor 41. The external power supply voltage Ext-Vcc is applied to the source/drain of the p MOS transistor 47. This p MOS transistor 47 permits high speed pulling up of a potential on the drain of the n MOS transistor 41 by its coupling capacitance. Even in the case where CE access is provided immediately after the power supply voltage has recovered, the p MOS transistor 47 can generate a reference voltage at a high speed.

In the second reference voltage generator 32 of this circuit configuration, since n MOS transistors 41 to 45 of five stages function diodes, respectively, a reference voltage five times larger than of the threshold voltage Vth(n) of each of nMOS transistors 41 to 45 can be provided. For example, when the threshold voltage Vth(n) is assumed to be 0.8 volts, the reference voltage in this case becomes equal to 4.0 volts. In addition, by allowing the resistor 46 to have a high resistance value, a current flowing in the second reference voltage generator 32 can be held down to a small value. Thus, low power consumption can be realized.

As described above, in accordance with a voltage supply circuit of this embodiment, for a transient time period from the standby state to the operating state during which an output from the first reference voltage generator 31 used in the operating state rises, the second reference voltage generator 32 of low power consumption generates a reference voltage. Thus, the CE access time can be reduced. Further, in the standby state, only the standby power supply voltage converter 34 and the second reference voltage generator 32 which both have a low power consumption become operative, whereas the first reference voltage generator 31 and the differential amplifier 35 which have a large power consumption are in an OFF state. Thus, the standby current can be held down to a small value. Further, in the case where a memory device in which the voltage supply circuit of the invention is used is constructed as a static RAM, a high resistance load is formed in the memory cells of the internal circuit 33. Accordingly, high resistance resistor 46 in the embodiment of the second reference voltage generator 32 can be easily formed by the same process.

Figure 7:
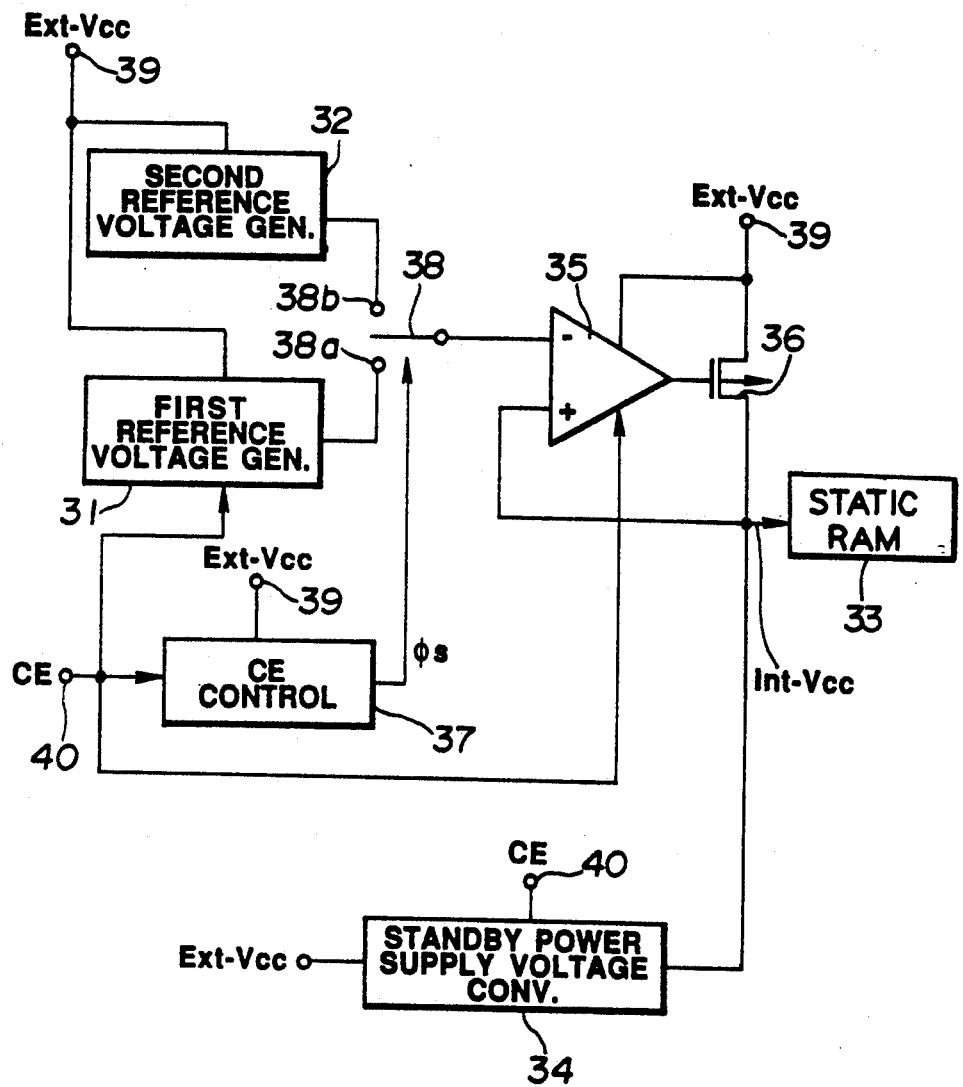
FIG. 7 is another embodiment of the block diagram of FIG. 4, wherein the internal circuit is a known static RAM.
Figure 8:
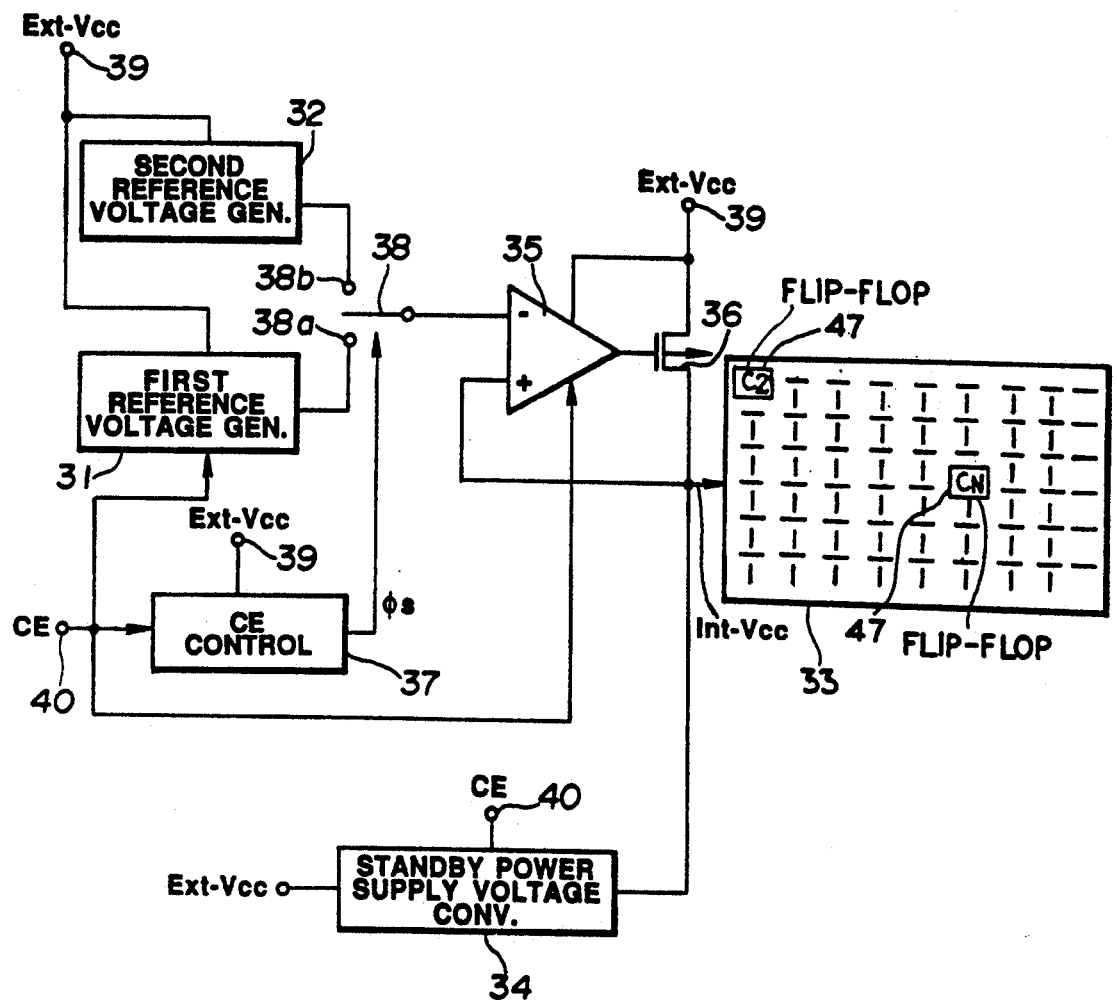
FIG. 8 is another embodiment of the block diagram of FIG. 7, wherein a memory cell array of the known static RAM is illustrated.

FIG. 8 illustrates a memory cell array for the known static RAM of FIG. 7. Each of the memory cells, or flip-flops, C1 . . . CN . . . have a resistor has a load.

What is claimed is:

1. A voltage supply circuit for supplying a reference voltage to an internal circuit of a semiconductor integrated circuit device to allow said internal circuit to be operative, said voltage supply circuit comprising:
a first reference voltage generator for supplying a reference voltage through an amplifier circuit to said internal circuit in an operating state, and caused to be inactive in a standby state, a power supply voltage converter for supplying a voltage to said internal circuit at least in said standby state, and a second reference voltage generator for driving said amplifier circuit during a transient time period from said standby state to said operating state.

2. A voltage supply circuit as set forth in claim 1, wherein there is provided a changeover switch in association with an input terminal of said amplifier circuit, said first reference voltage generator being connected to said amplifier circuit in said operating state by said changeover switch, said second reference voltage generator being connected to said amplifier circuit during a transient time period from said standby state to said operating state.

3. A voltage supply circuit as set forth in claim 2, wherein said amplifier circuit is caused to be inactive in said standby state.

4. A voltage supply circuit as set forth in claim 2, wherein whether said first reference voltage generator is active or inactive, and how said changeover switch is switched are controlled by a chip enable signal or a chip select signal externally given.

5. A voltage supply circuit as set forth in claim 1, wherein said second reference voltage generator is comprised of a plurality of MOS transistors subjected to diode connection, which are connected in series to an output terminal through a resistor.

6. A voltage supply circuit as set forth in claim 5, wherein a gate electrode of the MOS transistor connected to said resistor and an external power supply terminal are subjected to capacitance coupling.

7. A semiconductor memory device in which a static RAM is provided as an internal circuit, said device comprising:

a static RAM, a first reference voltage generator for supplying an internally pulled down reference voltage through an amplifier circuit to said static RAM in an operating state, and caused to be inactive in a standby state, a power supply voltage converter for supplying a voltage to said static RAM at least in said standby state, and a second reference voltage generator for driving said amplifier circuit during a transient time period from said standby state to said operating state.

8. A semiconductor memory device as set forth in claim 7, said static RAM including a memory cell array including memory cells each comprised of a MOS transistor, wherein each of said memory cells includes a pair of flip-flop circuits having a resistor element as a load, said second reference voltage generator being comprised of a plurality of MOS transistors subjected to diode connection, which are connected in series through a resistor element to an output terminal.

* * * * *